(12) United States Patent
Yamamoto

(10) Patent No.: US 11,233,497 B2
(45) Date of Patent: Jan. 25, 2022

(54) PIEZOELECTRIC VIBRATOR

(71) Applicant: Murata Manufacturing Co., Ltd., Nagaokakyo (JP)

(72) Inventor: Hiroyuki Yamamoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 573 days.

(21) Appl. No.: 16/283,011

(22) Filed: Feb. 22, 2019

(65) Prior Publication Data

US 2019/0190485 A1 Jun. 20, 2019

Related U.S. Application Data

(63) Continuation of application No. PCT/JP2017/028960, filed on Aug. 9, 2017.

(30) Foreign Application Priority Data

Aug. 31, 2016 (JP) .............................. JP2016-169722

(51) Int. Cl.
*H03H 9/19* (2006.01)
*H03H 9/10* (2006.01)
(Continued)

(52) U.S. Cl.
CPC ........... *H03H 9/0509* (2013.01); *H01L 24/29* (2013.01); *H03H 9/1021* (2013.01); *H03H 9/19* (2013.01);
(Continued)

(58) Field of Classification Search
CPC ....... H03H 9/0509; H03H 9/1021; H03H 9/19
See application file for complete search history.

(56) References Cited

U.S. PATENT DOCUMENTS 8,835,770 B2  9/2014 Oyama et al.
10,476,475 B2 * 11/2019 Kawai .................. H03H 9/0519
(Continued)

FOREIGN PATENT DOCUMENTS

JP   2009152717 A   7/2009
JP   2014150452 A   8/2014
WO  2011125414 A1  10/2011

OTHER PUBLICATIONS

International Search Report issued in PCT/JP2017/028960, dated Oct. 24, 2017.

(Continued)

*Primary Examiner* — J. San Martin
*Assistant Examiner* — Jaydi San Martin
(74) *Attorney, Agent, or Firm* — Arent Fox LLP

(57) ABSTRACT

A piezoelectric vibrator that includes a piezoelectric resonator, a substrate having opposite first and second principal surfaces, and an electrically conductive holding member holding the piezoelectric resonator on the first principal surface of the substrate such that the piezoelectric resonator is able to be excited. The electrically conductive holding member contains a first filler containing an electrically conductive material as a main component and a second filler containing an electrically insulating material as a main component and having a smaller Young's modulus than the first filler. In a plan view in a direction normal to the first principal surface of the substrate, the second filler is more densely disposed in an outer peripheral region of the electrically conductive holding member than in a central region of the electrically conductive holding member.

20 Claims, 3 Drawing Sheets

(51) Int. Cl.
*H03H 9/05* (2006.01)
*H01L 23/00* (2006.01)
(52) U.S. Cl.
CPC ............... *H01L 2224/29339* (2013.01); *H01L 2224/29391* (2013.01); *H01L 2924/16152* (2013.01)

(56) References Cited

U.S. PATENT DOCUMENTS

| | | | |
|---|---|---|---|
| 2013/0025931 A1 | 1/2013 | Oyama et al. | |
| 2018/0302033 A1* | 10/2018 | Yamazaki | ................ H03B 5/04 |
| 2019/0190486 A1* | 6/2019 | Sugimasa | ............ H03H 9/0509 |
| 2020/0366269 A1* | 11/2020 | Sasaki | .................. H03H 9/0519 |

OTHER PUBLICATIONS

Written Opinion of the International Searching Authority issued in PCT/JP2017/028960, dated Oct. 24, 2017.

\* cited by examiner

PIEZOELECTRIC VIBRATOR

CROSS REFERENCE TO RELATED APPLICATIONS

The present application is a continuation of International application No. PCT/JP2017/028960, filed Aug. 9, 2017, which claims priority to Japanese Patent Application No. 2016-169722, filed Aug. 31, 2016, the entire contents of each of which are incorporated herein by reference.

FIELD OF THE INVENTION

The present invention relates to a piezoelectric vibrator and, more particularly, to a piezoelectric vibrator in which a piezoelectric resonator is held on a substrate by an electrically conductive holding member.

BACKGROUND OF THE INVENTION

As one mode of a piezoelectric vibrator, a structure that a piezoelectric resonator is mounted on a principal surface of a substrate so as to be supported at one end is known. In such a structure, for example, an adhesive that provides electrical continuity between electrodes formed on the substrate and electrodes formed on the piezoelectric resonator and that also mechanically holds the piezoelectric resonator is used. For example, Patent Document 1 describes a piezoelectric device in which spherical spacers coated with a good conductor metal are mixed into an adhesive that holds a piezoelectric vibrating piece.

Patent Document 1: Japanese Unexamined Patent Application Publication No. 2014-150452

SUMMARY OF THE INVENTION

A piezoelectric resonator includes a piezoelectric substrate and excitation electrodes respectively provided on both principal surfaces of the piezoelectric substrate. In general, in a piezoelectric resonator, vibration progressively diminishes from an excitation portion sandwiched between the excitation electrodes toward an outer edge of the piezoelectric substrate. When a piezoelectric vibrator is miniaturized, in bonding the piezoelectric resonator to a substrate principal surface, an adhesive is applied to not only around the outer edge (that is, a region where vibration is diminished) of the piezoelectric resonator but also a portion near the excitation portion (that is, a region where vibration is not sufficiently diminished) of the piezoelectric resonator. In this regard, with the piezoelectric device as described in Patent Document 1, there is a problem that the adhesive bonded to a portion near the excitation portion of the piezoelectric resonator impedes vibration and, as a result, the characteristics of the piezoelectric vibrator degrade.

The present invention is made in view of such a situation, and it is an object of the present invention to provide a piezoelectric vibrator in which the degradation of vibrator characteristics is reduced even when a piezoelectric vibrator is miniaturized.

A piezoelectric vibrator according to an aspect of the present invention includes a piezoelectric resonator, a substrate, and an electrically conductive holding member. The substrate has opposite first and second principal surfaces. The electrically conductive holding member holds the piezoelectric resonator on the first principal surface of the substrate such that the piezoelectric resonator is able to be excited. The electrically conductive holding member contains a first filler and a second filler. The first filler contains an electrically conductive material as a main component. The second filler contains an electrically insulating material as a main component. The second filler is smaller in a value of Young's modulus than the first filler. In a plan view in a direction normal to the first principal surface of the substrate, the second filler is more densely disposed in an outer peripheral region of the electrically conductive holding member than in a central region of the electrically conductive holding member.

With the above configuration, the outer peripheral region of the electrically conductive holding member is smaller in the value of Young's modulus than the central region of the electrically conductive holding member. Therefore, the outer peripheral region (that is, a relatively soft region) of the electrically conductive holding member is bonded to a portion near an excitation portion (that is, a region where vibration is not sufficiently diminished) of the piezoelectric resonator. Therefore, the influence of bonding of the electrically conductive holding member on vibration reduces, and the degradation of vibrator characteristics of the piezoelectric vibrator is reduced.

A piezoelectric vibrator according to an aspect of the present invention includes a piezoelectric resonator, a substrate, and an electrically conductive holding member. The substrate has opposite first and second principal surfaces. The electrically conductive holding member holds the piezoelectric resonator on the first principal surface of the substrate such that the piezoelectric resonator is able to be excited. The electrically conductive holding member contains a first filler and a second filler. The first filler contains an electrically conductive material as a main component. The second filler contains an electrically insulating material as a main component. The second filler is smaller in a value of Young's modulus than the first filler. In a plan view in a direction normal to the first principal surface of the substrate, a ratio H1 of a volume of the first filler to a volume of the second filler in a central region of the electrically conductive holding member is higher than a ratio H2 of a volume of the first filler to a volume of the second filler in an outer peripheral region of the electrically conductive holding member.

With the above configuration, the outer peripheral region of the electrically conductive holding member is smaller in the value of Young's modulus than the central region of the electrically conductive holding member. Therefore, the outer peripheral region (that is, a relatively soft region) in the electrically conductive holding member is bonded to a portion near an excitation portion (that is, a region where vibration is not sufficiently diminished) of the piezoelectric resonator. Therefore, the influence of bonding of the electrically conductive holding member on vibration reduces, and the degradation of vibrator characteristics of the piezoelectric vibrator is reduced.

According to the present invention, it is possible to provide a piezoelectric vibrator of which the degradation of vibrator characteristics is reduced even when the piezoelectric vibrator is miniaturized.

DETAILED DESCRIPTION OF THE PREFERRED EMBODIMENTS

Hereinafter, an embodiment of the present invention is described. In the following description of the drawings, like or similar reference signs denote the same or similar elements. The drawings are illustrative, the dimensions and shapes of portions are schematic ones, and the technical scope of the invention of the subject application should not be interpreted limitedly to the embodiment.

Figure 1:
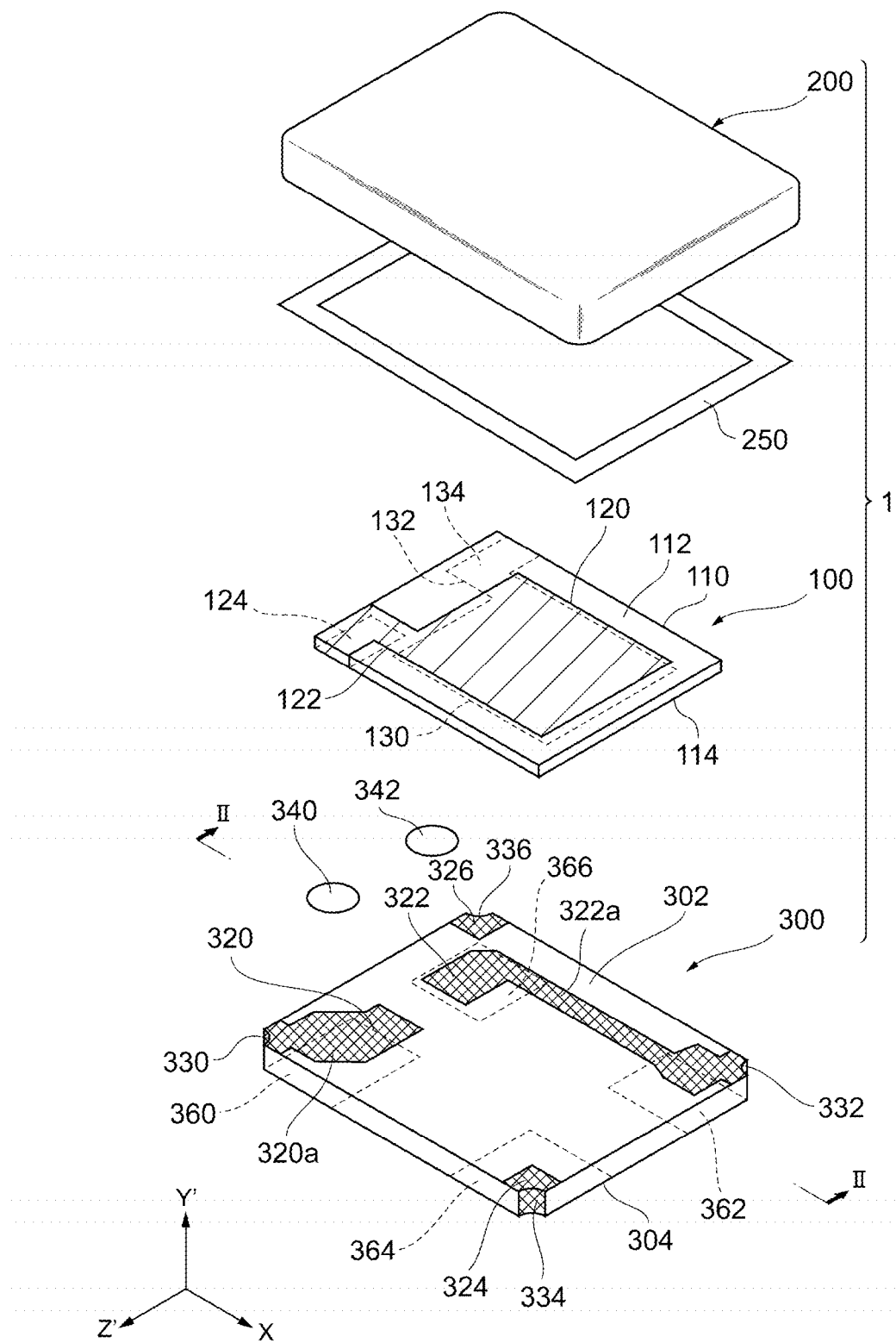
FIG. 1 is an exploded perspective view of a piezoelectric vibrator according to an embodiment of the present invention.
Figure 2:
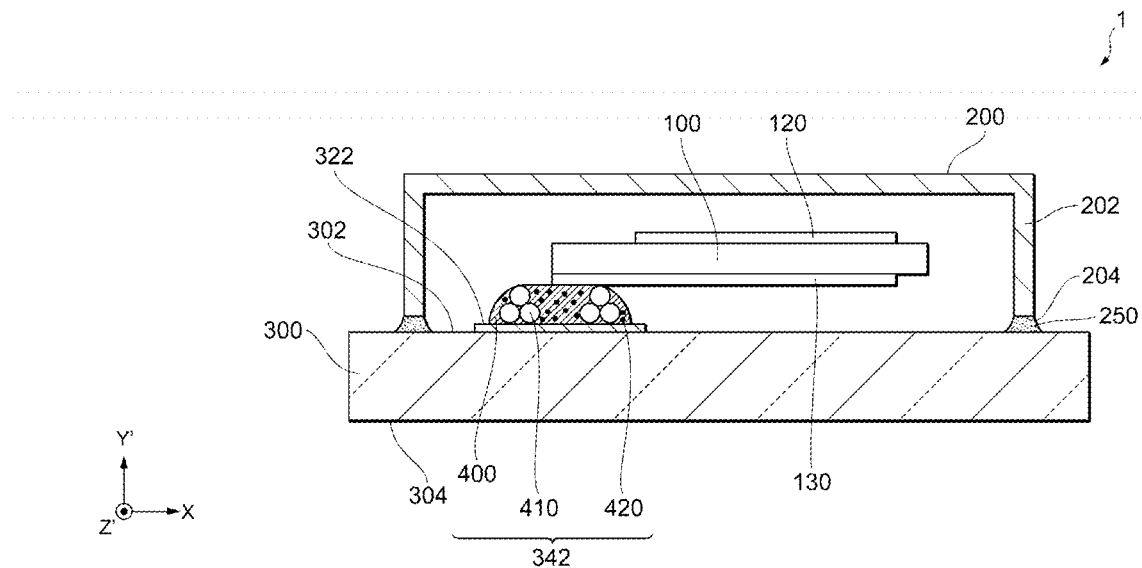
FIG. 2 is a sectional view taken along the line II-II in FIG. 1.

A piezoelectric vibrator 1 according to an embodiment of the present invention is described with reference to FIG. 1 and FIG. 2. FIG. 1 is an exploded perspective view of the piezoelectric vibrator according to the embodiment of the present invention. FIG. 2 is a sectional view taken along the line II-II in FIG. 1.

As illustrated in FIG. 1, the piezoelectric vibrator 1 according to the present embodiment includes a piezoelectric resonator 100, a cover member 200, and a substrate 300. The cover member 200 and the substrate 300 are part of a holder (case or package) for accommodating the piezoelectric resonator 100.

The piezoelectric resonator 100 includes a piezoelectric substrate 110, and excitation electrodes 120, 130 (hereinafter, also referred to as "first excitation electrode 120" and "second excitation electrode 130"). The excitation electrodes 120, 130 are respectively provided on both surfaces of the piezoelectric substrate 110.

The piezoelectric substrate 110 is made of a predetermined piezoelectric material. The material is not specifically limited. In the example illustrated in FIG. 1, the piezoelectric substrate 110 is made of a crystal material having a predetermined crystal orientation. The piezoelectric substrate 110 is, for example, an AT-cut quartz crystal element. An AT-cut quartz crystal element is cut with, where axes obtained by rotating a y-axis and a z-axis of an x-axis, y-axis, and z-axis that are crystal axes of an artificial crystal in a direction from the y-axis to the z-axis by 35 degrees and 15 minutes plus or minus one minute and 30 seconds about the x-axis are respectively a y'-axis and a z'-axis, surfaces parallel to a plane that is determined by the x-axis and the z'-axis (hereinafter, referred to as x-z' plane; the same applies to planes determined by other axes) being set as principal surfaces. In the example illustrated in FIG. 1, the piezoelectric substrate 110 that is an AT-cut quartz crystal element has long sides extending along the x-axis, short sides extending along the z'-axis, and sides in a thickness direction extending along the y'-axis, and has substantially a rectangular shape in the x-z' plane. A piezoelectric resonator that employs an AT-cut quartz crystal element has high frequency stability over a wide temperature range, and also has excellent aging characteristics. In addition, a piezoelectric resonator (that is, a quartz crystal resonator) that employs an AT-cut quartz crystal element has a thickness shear mode as a major vibration. Hereinafter, the components of the piezoelectric vibrator 1 are described with reference to the directions of the axes of AT cut.

The piezoelectric substrate is not limited to the above-described configuration. For example, a rectangular AT-cut quartz crystal element having long sides extending along the z'-axis and short sides extending along the x-axis may be applied. Alternatively, as long as the major vibration includes a thickness shear mode, the piezoelectric substrate may be, for example, a cut quartz crystal element, such as a BT-cut quartz crystal element, other than an AT-cut quartz crystal element. In addition, the material of the piezoelectric substrate is not limited to a quartz crystal. For example, piezoelectric ceramic, such as PZT, or another piezoelectric material, such as a zinc oxide, may also be used. In addition, the piezoelectric resonator may be, for example, micro electro mechanical systems (MEMS). Specifically, Si-MEMS in which MEMS are formed on a silicone substrate may be used. Furthermore, the piezoelectric resonator may be piezoelectric MEMS that employ a predetermined piezoelectric material, such as AlN, $LiTaO_3$, $LiNbO_3$, and PZT.

The first excitation electrode 120 is formed on a first principal surface 112 of the piezoelectric substrate 110. The second excitation electrode 130 is formed on a second principal surface 114 of the piezoelectric substrate 110. The first excitation electrode 120 and the second excitation electrode 130 are a pair of electrodes, and are disposed so as to overlap each other in substantially the entire area in a plan view of the x-z' plane. The piezoelectric substrate 110 has an excitation portion sandwiched between the first excitation electrode 120 and the second excitation electrode 130.

A connection electrode 124 is electrically connected to the first excitation electrode 120 via an extended electrode 122. The connection electrode 124 is formed on the piezoelectric substrate 110. A connection electrode 134 is electrically connected to the second excitation electrode 130 via an extended electrode 132. The connection electrode 134 is formed on the piezoelectric substrate 110. Specifically, the extended electrode 122 is extended from the first excitation electrode 120 toward the short side in the negative direction of the x-axis on the first principal surface 112, further extended along the side surface of the piezoelectric substrate 110 in the positive direction of the z'-axis, and then connected to the connection electrode 124 formed on the second principal surface 114. On the other hand, the extended electrode 132 is extended from the second excitation electrode 130 toward the short side in the negative direction of the x-axis on the second principal surface 114, and then connected to the connection electrode 134 formed on the second principal surface 114. The connection electrodes 124, 134 are disposed along the short side in the negative direction of the x-axis. The connection electrode 124 provides electrical continuity for the substrate 300 via an electrically conductive holding member 340 (described later), and is mechanically held on the substrate 300 via the electrically conductive holding member 340. The connection electrode 134 provides electrical continuity for the substrate 300 via an electrically conductive holding member 342 (described later), and is mechanically held on the substrate 300 via the electrically conductive holding member 342. The disposition and pattern shapes of the connection electrodes 124, 134 and extended electrodes 122, 132 are not limited, and may be modified as needed in consideration of electrical connection with other members.

Each of the above-described electrodes including the first excitation electrode 120 and the second excitation electrode 130 is, for example, made such that a chromium (Cr) layer for enhancing bonding force is formed as an underlying layer on the surface of the piezoelectric substrate 110 and a gold (Au) layer is formed on the surface of the chromium layer. The materials are not limited thereto.

As illustrated in FIG. 2, the cover member 200 has a recess that is open opposite the first principal surface 302 of the substrate 300. The cover member 200 includes a side wall portion 202 formed so as to be upright from the bottom surface of the recess over the entire perimeter of the opening. The side wall portion 202 has an end face 204 that faces the first principal surface 302 of the substrate 300. The end face 204 is bonded to the first principal surface 302 of the substrate 300 with a bonding material 250 interposed therebetween. The cover member 200 may have any shape as long as the cover member 200 is able to accommodate the piezoelectric resonator 100 in the internal space when the cover member 200 is bonded to the substrate 300. The shape of the cover member 200 is not specifically limited. The material of the cover member 200 is not specifically limited; however, the material of the cover member 200 may be, for example, an electrically conductive material, such as a metal. With this configuration, it is possible to add a shield function by electrically connecting the cover member 200 to a grounding potential. When the cover member 200 is made of a metal, the cover member 200 may be, for example, made of an alloy containing iron (Fe) and nickel (Ni) (for example, 42 alloy). Alternatively, a surface layer, such as a gold (Au) layer, may be further formed on the surface of the cover member 200. When a metal is formed on the surface, it is possible to prevent oxidation of the cover member 200. Alternatively, the cover member 200 may be made of an electrically insulating material or a composite structural material of an electrically conductive material and an electrically insulating material.

Referring again to FIG. 1, the substrate 300 holds the piezoelectric resonator 100 such that the piezoelectric resonator 100 is able to be excited. In the example illustrated in FIG. 1, the piezoelectric resonator 100 is held on the first principal surface 302 of the substrate 300 with the electrically conductive holding members 340, 342 interposed therebetween so as to be able to be excited.

The substrate 300 has long sides extending along the x-axis, short sides extending along the z'-axis, and sides in a thickness direction extending along the y'-axis, and has substantially a rectangular shape in the x-z' plane. The substrate 300 is made of, for example, single-layer electrically insulating ceramic. As another embodiment, the substrate 300 may be made by sintering a plurality of laminated electrically insulating ceramic sheets. The substrate 300 is preferably made of a heat-resistance material. The substrate 300 may have a flat sheet shape as illustrated in FIG. 1 or may have a recessed shape that is open opposite the cover member 200.

Connection electrodes 320, 322, corner electrodes 324, 326, and extended electrodes 320a, 322a are formed on the first principal surface 302 of the substrate 300. Side electrodes 330, 332, 334, 336 are formed on the side surfaces of the substrate 300. Outer electrodes 360, 362, 364, 366 are formed on the second principal surface 304 of the substrate 300.

The connection electrodes 320, 322 are formed along the short side in the negative direction of the x-axis at a distance from the short side on the first principal surface 302 of the substrate 300. The connection electrode 320 is connected to the connection electrode 124 of the piezoelectric resonator 100 via the electrically conductive holding member 340. The connection electrode 322 is connected to the connection electrode 134 of the piezoelectric resonator 100 via the electrically conductive holding member 342. The material of each of the connection electrodes 320, 322 is not specifically limited, and is, for example, a laminate of molybdenum (Mo), nickel (Ni), and gold (Au). The detailed configuration of each of the electrically conductive holding members 340, 342 is described later.

The extended electrode 320a is extended from the connection electrode 320 toward the side electrode 330 provided at one corner portion of the substrate 300. The extended electrode 322a is extended along the x-axis direction from the connection electrode 322 toward the side electrode 332 provided at the corner portion of the substrate 300, diagonally opposite to the side electrode 330.

In the present embodiment, the corner electrodes 324, 326 are formed at the remaining corner portions (corner portions other than the corner portions at which the extended electrodes 320a, 322a electrically connected to the connection electrodes 320, 322 are disposed). The corner electrodes 324, 326 are electrodes that are electrically connected to neither the first excitation electrode 120 nor the second excitation electrode 130.

Each of the plurality of side electrodes 330, 332, 334, 336 is formed on the side surface around a corresponding one of the corner portions of the substrate 300. In addition, each of the plurality of outer electrodes 360, 362, 364, 366 is formed around a corresponding one of the corner portions on the second principal surface 304 of the substrate 300. Specifically, the side electrode 330 and the outer electrode 360 are disposed at the corner portion in the negative direction of the x-axis and the positive direction of the z'-axis, the side electrode 332 and the outer electrode 362 are disposed at the corner portion in the positive direction of the x-axis and the negative direction of the z'-axis, the side electrode 334 and the outer electrode 364 are disposed at the corner portion in the positive direction of the x-axis and the positive direction of the z'-axis, and the side electrode 336 and the outer electrode 366 are disposed at the corner portion in the negative direction of the x-axis and the negative direction of the z'-axis.

The side electrodes 330, 332, 334, 336 are provided to electrically connect the electrodes on the first principal surface 302 to the electrodes on the second principal surface 304. In the example illustrated in FIG. 1, the corner portions of the substrate 300 partially form cutout side surfaces formed by cutting into a cylindrical curved surface shape (also referred to as castellation shape), and the side electrodes 330, 332, 334, 336 are formed on the cutout side surfaces. The shape of each of the corner portions of the substrate 300 is not limited to this shape. The shape of each cutout may be a planar shape. Alternatively, the substrate 300 may be a rectangular shape with no cutout, and may have four corners with right angles in a plan view.

The outer electrodes 360, 362, 364, 366 are electrodes for electrical connection with a mounting substrate (not shown). The outer electrodes 360, 362, 364, 366 are respectively electrically connected to the side electrodes 330, 332, 334, 336 formed on the side surfaces of the corresponding corner portions. Thus, the outer electrodes 360, 362, 364, 366 are respectively able to be electrically continuous with the electrodes on the first principal surface 302 of the substrate 300 via the side electrodes 330, 332, 334, 336.

Specifically, among the plurality of outer electrodes, the outer electrode 360 is electrically connected to the first excitation electrode 120 via the side electrode 330, the extended electrode 320a, the connection electrode 320, and the electrically conductive holding member 340, and the outer electrode 362 is electrically connected to the second excitation electrode 130 via the side electrode 332, the extended electrode 322a, the connection electrode 322, and the electrically conductive holding member 342. That is, the outer electrodes 360, 362 each are an input/output terminal that is electrically connected to the first excitation electrode 120 or the second excitation electrode 130.

In addition, the remaining outer electrodes 364, 366 are dummy electrodes that are not electrically connected to the first excitation electrode 120 or second excitation electrode 130 of the piezoelectric resonator 100. By forming the outer electrodes 364, 366, the outer electrodes are formed at all the corner portions, and therefore a process of electrically connecting the piezoelectric vibrator 1 to another member is easy. The outer electrodes 364, 366 may have the function of a grounding electrode to which a ground potential is supplied. For example, when the cover member 200 is made of an electrically conductive material, a shield function is given to the cover member 200 by electrically connecting the cover member 200 to the outer electrodes 364, 366 that are grounding electrodes.

The configurations of the connection electrodes, corner electrodes, extended electrodes, side electrodes, and outer electrodes, formed on the substrate 300, are not limited to the above-described example, and may be applied with various modifications. For example, the number of the outer electrodes is not limited to four. For example, the outer electrodes may be only two diagonally disposed input/output terminals. In addition, the side electrodes are not limited to the ones disposed at some of the corner portions. The side electrodes may be formed on any side surfaces of the substrate 300 except the corner portions. In this case, as is already described, cutout side surfaces may be formed by partially cutting side surfaces into a cylindrical curved surface shape, and side electrodes may be formed on the side surfaces except the corner portions. Furthermore, the corner electrodes 324, 326, the side electrodes 334, 336, and the outer electrodes 364, 366 are not necessarily formed. In addition, through-holes may be formed so as to extend through the substrate 300 from the first principal surface 302 to the second principal surface 304, and electrical continuity from the connection electrodes formed on the first principal surface 302 to the second principal surface 304 may be provided by the through-holes.

The bonding material 250 is provided all around each of the cover member 200 and the substrate 300, and bonds the end face 204 of the side wall portion 202 of the cover member 200 to the first principal surface 302 of the substrate 300. The material of the bonding material 250 is not limited. For example, the material may be a gold (Au)-tin (Sn) eutectic alloy. By employing metal bonding for bonding of the cover member to the substrate, when the cover member is made of an electrically conductive material, electrical continuity between the cover member and the substrate is achieved. In addition, sealing performance is improved.

When both the cover member 200 and the substrate 300 are bonded to each other with the bonding material 250 interposed therebetween, the piezoelectric resonator 100 is hermetically sealed in the internal space (cavity) surrounded by the recess of the cover member 200 and the substrate 300. In this case, a pressure in the internal space is preferably in a vacuum state and is lower than atmospheric pressure. Thus, aging, or the like, of the first excitation electrode 120 and second excitation electrode 130 due to oxidation is reduced.

With the above-described configuration, in the piezoelectric vibrator 1, an alternating electric field is applied between the pair of first excitation electrode 120 and second excitation electrode 130 in the piezoelectric resonator 100 via the outer electrodes 360, 362 of the substrate 300. Thus, the piezoelectric substrate 110 vibrates in a vibration mode including the thickness shear mode, and resonance characteristics resulting from the vibration are obtained.

Figure 3:
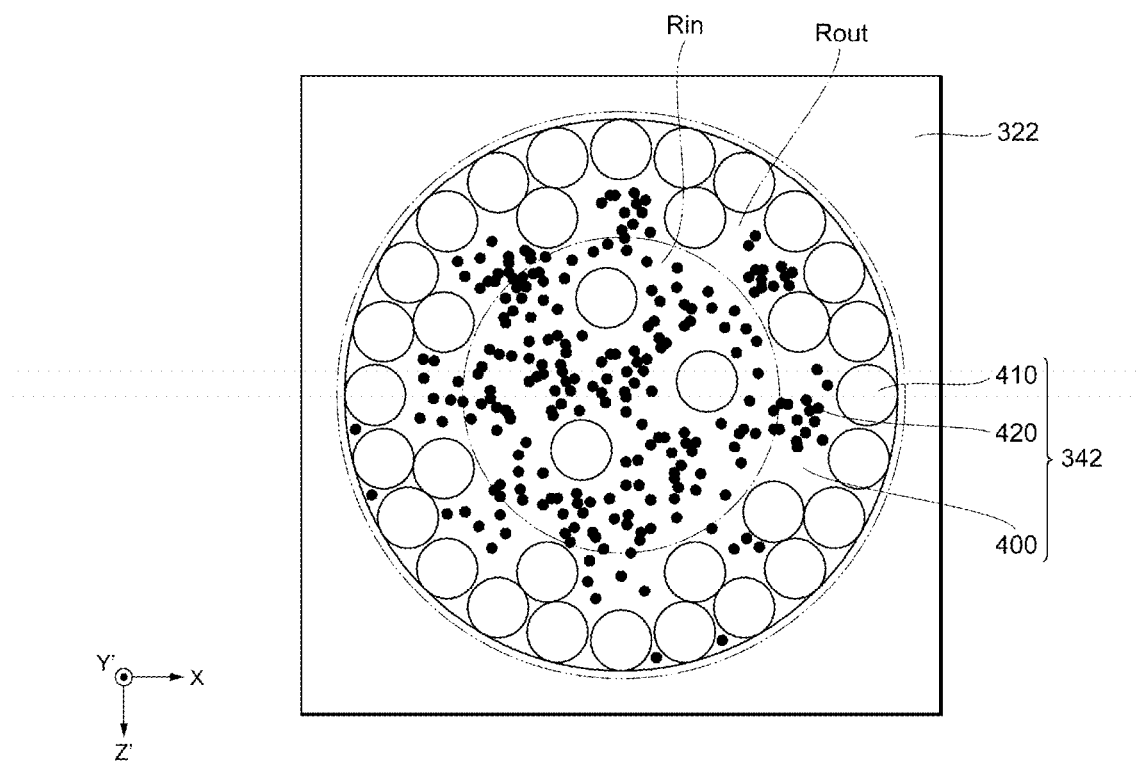
FIG. 3 is a view that schematically illustrates a top view of an electrically conductive holding member.
Figure 4:
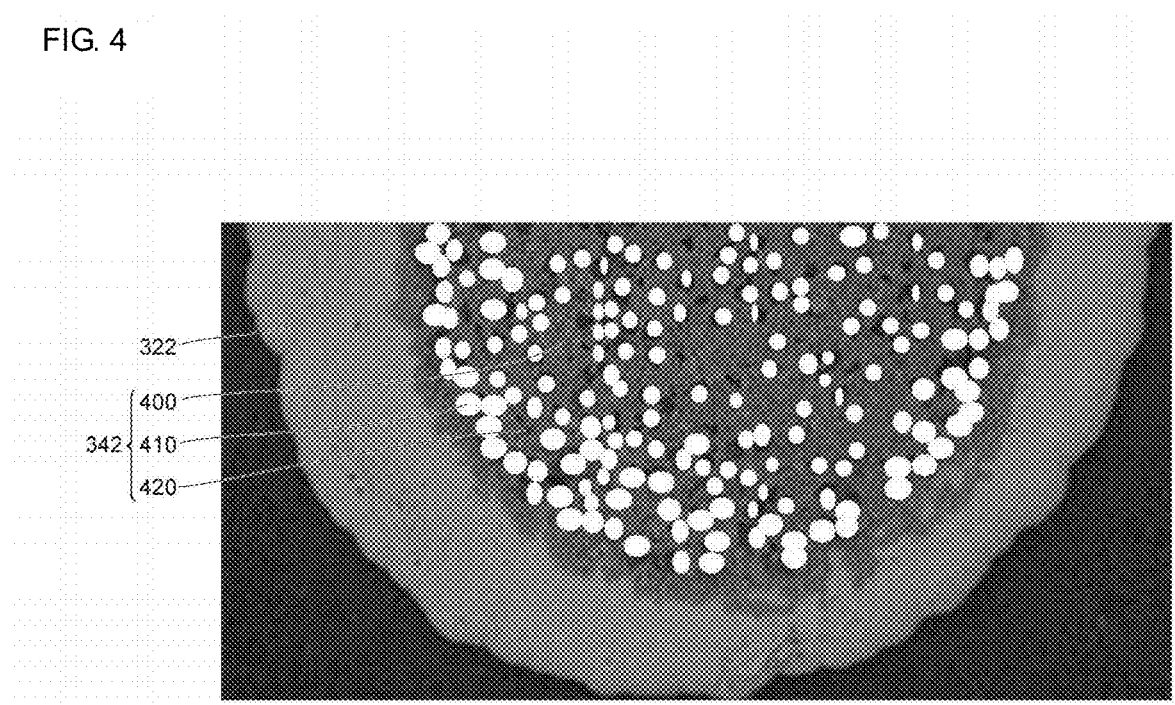
FIG. 4 is a micrograph of the electrically conductive holding member.

Next, the detailed configuration of the electrically conductive holding members is described with reference to FIG. 2 to FIG. 4 by taking the electrically conductive holding member 342 as an example. Since the electrically conductive holding member 340 is similar to the electrically conductive holding member 342, the detailed description thereof is omitted. FIG. 3 is a view that schematically illustrates a top view of the electrically conductive holding member. FIG. 4 is a micrograph of the electrically conductive holding member. Specifically, FIG. 3 schematically illustrates a top view of the electrically conductive holding member 342 provided on the connection electrode 322 in a plan view (that is, the plan view of the x-z' plane) in the direction (y'-axis direction) normal to the first principal surface 302 of the substrate 300. In FIG. 3, the connection electrode 322 is illustrated in a rectangular shape for the sake of convenience of illustration; however, the shape of the connection electrode is not limited to the rectangular shape.

The electrically conductive holding member 342 is, for example, formed by thermosetting an adhesive. The electrically conductive holding member 342 holds the piezoelectric resonator 100 such that the piezoelectric resonator 100 is able to be excited, and provides electrical continuity between the connection electrode 134 formed on the piezoelectric resonator 100 and the connection electrode 322 formed on the substrate 300. As illustrated in FIG. 3, the electrically conductive holding member 342 has, for example, a round shape in the plan view of the x-z' plane. For example, the round shape includes a circular shape or an elliptical shape. Alternatively, the electrically conductive holding member 342 may have another shape, such as a rectangular shape, in the plan view of the x-z' plane. As illustrated in FIG. 2 and FIG. 3, the electrically conductive holding member 342 contains an adhesive (binder) 400, a plurality of spherical spacers 410 (second filler), and a plurality of metal particles 420 (first filler). The plurality of spherical spacers 410 and the plurality of metal particles 420 are mixed into the adhesive 400. The adhesive 400, for example, contains a resin as a main component.

Each of the plurality of spherical spacers 410, for example, has as spherical shape and contains an elastic rubber or a plastic or other resin, such as a silicone-based resin, as a main component. For example, the spherical shape includes a sphere, an ellipsoid, and the like. In the present embodiment, each of the spherical spacers 410 is not coated with a metal, and a resin material is exposed on the surface. The thus configured spherical spacer is smaller in the value of Young's modulus than a spherical spacer coated with a metal, and is lower in acoustic impedance than the spherical spacer coated with a metal. In addition, each of the spherical spacers 410 is smaller in the value of Young's modulus than each of the metal particles 420, and is lower in acoustic impedance than each of the metal particles 420.

Each of the plurality of metal particles 420 is a particle composed of a plurality of bonded metal atoms. The material of the plurality of metal particles 420 is not specifically limited. The material is, for example, silver (Ag), or the like. A holding member is cured while the metal particles 420 are in contact with each other inside the adhesive 400 and thus, the holding member has electrical conductivity. The particle size of the metal particles 420 is, for example, smaller than the gap formed by the spherical spacers 410 such that each of the plurality of metal particles 420 enters any gap formed by the plurality of spherical spacers 410 disposed on the connection electrode 322.

In the example illustrated in FIG. 2, the plurality of spherical spacers 410 is, for example, stacked in two layers in a height direction (y'-axis direction) on the surface of the connection electrode 322. Thus, the piezoelectric resonator 100 is held with a predetermined clearance from the first principal surface 302 of the substrate 300. The predetermined clearance is a clearance (for example, approximately 10 μm) corresponding to twice as large as the outside dimension (for example, approximately 6 μm) of each spherical spacer 410. Therefore, a distance between the second principal surface 114 of the piezoelectric resonator 100 and the first principal surface 302 of the substrate 300 is kept constant, and the magnitude of a parasitic capacitance that is generated between the electrodes formed on both the principal surfaces is kept constant. The number of stacked layers of spherical spacers is not limited to two, and may be one or may be three or more.

In the piezoelectric resonator 100, generally, vibration progressively diminishes from the excitation portion toward the outer edge of the piezoelectric substrate 110. Therefore, if an electrically conductive holding member is uniformly hard, the electrically conductive holding member is bonded to a portion near the excitation portion of the piezoelectric resonator, specifically, a region where vibration is not sufficiently diminished, with miniaturization of the piezoelectric vibrator, with the result that the electrically conductive holding member can impede vibration. Specifically, for example, vibration can leak from the piezoelectric resonator 100 to the substrate 300 via the electrically conductive holding member.

In the present embodiment, as illustrated in FIG. 3, in the plan view in the direction (y'-axis direction) normal to the first principal surface 302 of the substrate 300, the spherical spacers 410 are more densely disposed in an outer peripheral region Rout of the electrically conductive holding member 342 than in a central region Rin of the electrically conductive holding member 342. On the other hand, the metal particles 420 are disposed more densely in the central region Rin of the electrically conductive holding member 342 than in the outer peripheral region Rout of the electrically conductive holding member 342. In addition, in the present embodiment, the ratio H1 of the volume of the metal particles 420 to the volume of the spherical spacers 410 in the central region Rin of the electrically conductive holding member 342 is higher than the ratio H2 of the volume of the metal particles 420 to the volume of the spherical spacers 410 in the outer peripheral region Rout of the electrically conductive holding member 342. In addition, as described above, the spherical spacers 410 are softer than the metal particles 420. Thus, in the electrically conductive holding member 342, the hard metal particles 420 are dense in the central region Rin, and the soft spherical spacers 410 are dense in the outer peripheral region Rout, and thus, the outer peripheral region Rout is softer than the central region Rin.

FIG. 4 is a micrograph when viewed in the direction (y'-axis direction) normal to the first principal surface 302 of the substrate 300 after the piezoelectric resonator 100 is peeled off from the electrically conductive holding member 342 to which the piezoelectric resonator 100 has been bonded. In FIG. 4, to clearly indicate the spherical spacers 410, the spherical spacers 410 are indicated by white circles. In addition, the connection electrode 322 has a round shape.

As shown in FIG. 4, it appears that the spherical spacers 410 are denser in the outer peripheral region of the electrically conductive holding member 342 than in the central region of the electrically conductive holding member 342. Particularly, at the outer edge of the electrically conductive holding member 342, the spherical spacers 410 are disposed next to each other so as to surround the central region.

With the above-described configuration, in the present embodiment, the relatively soft outer peripheral region Rout of each of the electrically conductive holding members 340, 342 is bonded to a portion near the excitation portion of the piezoelectric resonator 100, specifically, a region where vibration is not sufficiently diminished, and the relatively hard central region Rin of each of the electrically conductive holding members 340, 342 is bonded to a portion around the outer edge of the piezoelectric resonator 100, specifically, a region where vibration is diminished (see FIG. 2). Thus, the electrically conductive holding members 340, 342 have less influence of bonding on vibrator characteristics than an adhesive having a uniform value of Young's modulus.

That is, the outer peripheral region Rout of each of the electrically conductive holding members 340, 342 is relatively soft, and has a low acoustic impedance. Therefore, in the region in which vibration of the piezoelectric resonator 100 is not sufficiently diminished, the electrically conductive holding members 340, 342 having a relatively low acoustic impedance are bonded to the piezoelectric resonator 100 and substrate 300 having a relatively high acoustic impedance, and a large difference in acoustic impedance is obtained. Thus, as compared to the case where a uniformly hard adhesive is used, reflected waves increase and transmitted waves reduce at the interfaces between the piezoelectric resonator 100 and the electrically conductive holding members 340, 342, and vibration that leaks from the piezoelectric resonator 100 to the substrate 300 via the electrically conductive holding member 340 or the electrically conductive holding member 342 reduces. Therefore, an impediment of vibration due to bonding of the electrically conductive holding members is reduced, and an equivalent series resistance (ESR) that corresponds to a loss component of vibration energy is decreased. Hence, the degradation of the characteristics of the piezoelectric vibrator is reduced.

In addition, the electrically conductive holding members 340, 342 are also allowed to be bonded to a portion near the excitation portion of the piezoelectric resonator 100, and the area of bonding between each of the electrically conductive holding members 340, 342 and the piezoelectric resonator 100 increases. Therefore, even when the piezoelectric vibrator is miniaturized, bonding strength is improved while the degradation of the characteristics of the piezoelectric vibrator is reduced.

In addition, the ratio H1 of the volume of the metal particles 420 to the volume of the spherical spacers 410 in the central region Rin of each of the electrically conductive holding members 340, 342 is higher than the ratio H2 of the volume of the metal particles 420 to the volume of the spherical spacers 410 in the outer peripheral region Rout of a corresponding one of the electrically conductive holding members 340, 342. In addition, the metal particles 420 each contain an electrically conductive material as a main component, and the spherical spacers 410 each contain an electrically insulating material as a main component. Therefore, the electrical conductivity of the central region Rin per unit area improves, and the reliability of the electrical conductivity of each of the electrically conductive holding members 340, 342 improves.

In addition, in the present embodiment, since each spherical spacer does not need to be coated with a metal, manufacturing cost reduces as compared to a configuration in which each spherical spacer is coated with a metal.

In the example illustrated in FIG. 1, one end of the piezoelectric resonator 100 is fixed by the electrically conductive holding members 340, 342, and the other end of the piezoelectric resonator 100 is free. Instead, both ends of the piezoelectric resonator 100 may be fixed to the substrate 300. That is, the connection electrodes 320, 322 may be disposed at mutually different sides on the first principal surface 302 of the substrate 300. For example, one of the connection electrodes 320, 322 is formed in the positive direction of the x-axis, and the other one of the connection electrodes 320, 322 is formed in the negative direction of the x-axis.

In addition, the disposition of the spherical spacers 410 and the metal particles 420 is not limited to the above-described configuration. For example, metal particles may be uniformly disposed in the electrically conductive holding member, and spherical spacers may be disposed more densely in the outer peripheral region of the electrically conductive holding member than in the central region of the electrically conductive holding member.

Figure 5:
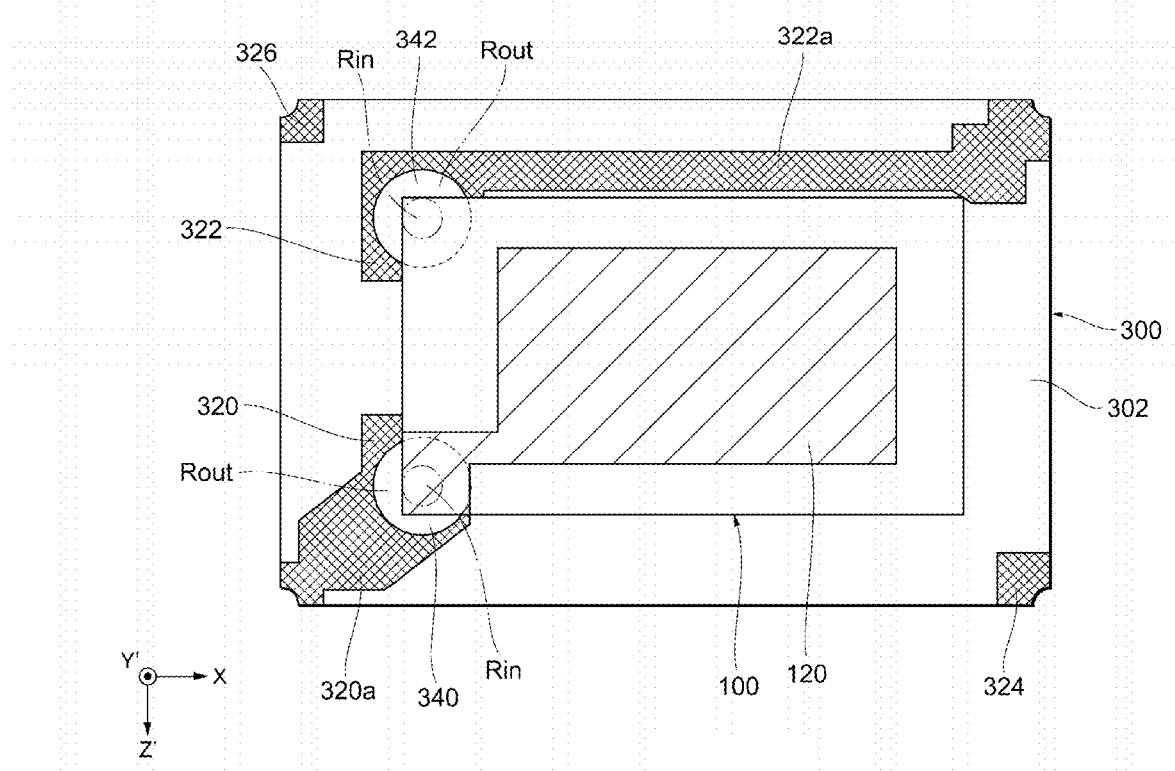
FIG. 5 is a plan view of the piezoelectric vibrator according to the embodiment of the present invention.

FIG. 5 is a plan view of the piezoelectric vibrator according to the embodiment of the present invention. FIG. 5 is a view without the cover member 200 and the bonding material 250, omitted from the piezoelectric vibrator 1 illustrated in FIG. 1.

As illustrated in FIG. 5, in the present embodiment, in the plan view in the direction (y'-axis direction) normal to the first principal surface 302 of the substrate 300, part of the outer peripheral region Rout of each of the electrically conductive holding members 340, 342 is disposed outside the outer edge of the piezoelectric resonator 100. Thus, the central region Rin that is relatively large in the value of Young's modulus in each of the electrically conductive holding members 340, 342 is bonded to around the outer edge of the piezoelectric resonator 100. Since vibration is sufficiently diminished around the outer edge of the piezoelectric resonator 100, the influence of bonding of the electrically conductive holding members 340, 342 on vibration of the piezoelectric resonator 100 is small. Therefore, the degradation of the vibrator characteristics of the piezoelectric vibrator is reduced.

The exemplary embodiment of the present invention is described above. In the piezoelectric vibrator 1, each of the electrically conductive holding members 340, 342 contains the plurality of metal particles 420 and the plurality of spherical spacers 410 lower in the value of Young's modulus than the plurality of metal particles, and, in the plan view of the x-z' plane, the spherical spacers 410 are more densely disposed in the outer peripheral region Rout of each of the electrically conductive holding members 340, 342 than in the central region Rin of a corresponding one of the electrically conductive holding members 340, 342. Thus, the outer peripheral region Rout of each of the electrically conductive holding members 340, 342, softer than the central region Rin of a corresponding one of the electrically conductive holding members 340, 342, is bonded to a portion near the excitation portion of the piezoelectric resonator 100 (that is, a region in which vibration is not sufficiently diminished). Therefore, vibration that leaks from the piezoelectric resonator 100 to the substrate 300 via the electrically conductive holding member 340 or the electrically conductive holding member 342 reduces, so the degradation of the vibrator characteristics of the piezoelectric vibrator 1 is reduced. In addition, since the area of bonding between each of the electrically conductive holding members 340, 342 and the piezoelectric resonator 100 increases, bonding strength improves.

In addition, in the piezoelectric vibrator 1, in the plan view of the x-z' plane of each of the electrically conductive holding members 340, 342, the metal particles 420 are more densely disposed in the central region Rin of each of the electrically conductive holding members 340, 342 than in the outer peripheral region Rout of a corresponding one of the electrically conductive holding members 340, 342. Thus, the electrical conductivity of the central region Rin of each of the electrically conductive holding members 340, 342 per unit area improves, so the reliability of the electrical conductivity improves.

In addition, in the piezoelectric vibrator 1, the ratio H1 of the volume of the metal particles 420 to the volume of the spherical spacers 410 in the central region Rin of each of the electrically conductive holding members 340, 342 is higher than the ratio H2 of the volume of the metal particles 420 to the volume of the spherical spacers 410 in the outer peripheral region Rout of a corresponding one of the electrically conductive holding members 340, 342. Thus, the outer peripheral region Rout of each of the electrically conductive holding members 340, 342, softer than the central region Rin of a corresponding one of the electrically conductive holding members 340, 342, is bonded to a portion near the excitation portion of the piezoelectric resonator 100 (that is, a region in which vibration is not sufficiently diminished). Therefore, vibration that leaks from the piezoelectric resonator 100 to the substrate 300 via the electrically conductive holding member 340 or the electrically conductive holding member 342 reduces, and the degradation of the vibrator characteristics of the piezoelectric vibrator 1 is reduced. In addition, since the area of bonding between each of the electrically conductive holding members 340, 342 and the piezoelectric resonator 100 increases, bonding strength improves. In addition, the electrical conductivity of the central region Rin of each of the electrically conductive holding members 340, 342 per unit area improves, and the reliability of the electrical conductivity improves.

In addition, in the piezoelectric vibrator 1, in the plan view of the x-z' plane, part of the outer peripheral region Rout of each of the electrically conductive holding members 340, 342 is disposed outside the outer edge of the piezoelectric resonator 100. Thus, the central region Rin that is relatively large in the value of Young's modulus in each of the electrically conductive holding members 340, 342 is bonded to around the outer edge of the piezoelectric resonator 100 where vibration is sufficiently diminished. Therefore, the influence of bonding of the electrically conductive holding members 340, 342 on the vibration of the piezoelectric resonator 100 is small, and the degradation of the vibrator characteristics of the piezoelectric vibrator 1 is reduced.

In addition, in the piezoelectric vibrator 1, the piezoelectric resonator 100 is held with the predetermined clearance from the first principal surface 302 of the substrate 300 because of mixing of the spherical spacers 410. Therefore, the magnitude of a parasitic capacitance that is generated between the electrode formed on the second principal surface 114 of the piezoelectric resonator 100 and the electrode formed on the first principal surface 302 of the substrate 300 is kept constant.

In addition, the material of the metal particles 420 is not specifically limited. The metal particles 420 each may contain, for example, silver as a main component.

In addition, the material of the spherical spacers 410 is not specifically limited. The spherical spacers 410 each may contain, for example, a silicone-based resin as a main component.

The above-described embodiments are intended to easily understand the present invention, and are not intended to interpret the present invention limitedly. The present invention may be modified or improved without departing from the scope of the present invention. The present invention also encompasses equivalents thereof. That is, ones modified with appropriate design changes from the embodiments by persons skilled in the art are also included in the scope of the present invention as long as the ones include the characteristics of the present invention. For example, the elements of the embodiments, and the disposition, materials, conditions, shapes, sizes, and the like, of the elements, are not limited to the illustrated ones, and may be changed as needed. In addition, the elements of the embodiments may be combined with each other as long as it is technically possible, and combinations of these are also included in the scope of the present invention as long as the combinations include the characteristics of the present invention.

REFERENCE SIGNS LIST 1 piezoelectric vibrator
100 piezoelectric resonator
110 piezoelectric substrate
120, 130 excitation electrode
122, 132 extended electrode
124, 134 connection electrode
200 cover member
250 bonding material
300 substrate
320, 322 connection electrode
320a, 322a extended electrode
324, 326 corner electrode
330, 332, 334, 336 side electrode
340, 342 electrically conductive holding member
360, 362, 364, 366 outer electrode
400 adhesive
410 spherical spacer
420 metal particle
Rin central region
Rout outer peripheral region

The invention claimed is:

1. A piezoelectric vibrator comprising:
a piezoelectric resonator;
a substrate having opposite first and second principal surfaces; and
an electrically conductive holding member holding the piezoelectric resonator on the first principal surface of the substrate such that the piezoelectric resonator is able to be excited, wherein the electrically conductive holding member comprises:
an adhesive;
a first filler mixed in the adhesive, the first filler containing an electrically conductive material as a main component thereof; and
a second filler mixed in the adhesive, the second filler containing an electrically insulating material as a main component thereof and having a smaller Young's modulus than the first filler, and
in a plan view in a direction normal to the first principal surface of the substrate, the second filler is more densely disposed in an outer peripheral region of the electrically conductive holding member than in a central region of the electrically conductive holding member.

2. The piezoelectric vibrator according to claim 1, wherein in the plan view in the direction normal to the first principal surface of the substrate, the first filler is more densely disposed in the central region of the electrically conductive holding member than in the outer peripheral region of the electrically conductive holding member.

3. The piezoelectric vibrator according to claim 1, wherein in the plan view in the direction normal to the first principal surface of the substrate, part of the outer peripheral region of the electrically conductive holding member is disposed outside an outer edge of the piezoelectric resonator.

4. The piezoelectric vibrator according to claim 1, wherein the second filler comprises a plurality of spherical spacers that hold the piezoelectric resonator with a predetermined clearance from the first principal surface of the substrate.

5. The piezoelectric vibrator according to claim 4, wherein the plurality of spherical particles are not coated with a metal.

6. The piezoelectric vibrator according to claim 4, wherein the plurality of spherical spacers are stacked in two layers in a height direction on the first principal surface of the substrate.

7. The piezoelectric vibrator according to claim 1, wherein the first filler contains silver as a main component.

8. The piezoelectric vibrator according to claim 7, wherein the second filler contains a silicone-based resin as a main component.

9. The piezoelectric vibrator according to claim 1, wherein the second filler contains a silicone-based resin as a main component.

10. The piezoelectric vibrator according to claim 1, further comprising a cover member bonded to the substrate such that the piezoelectric resonator is accommodated within an internal space defined by the cover member and the substrate.

11. The piezoelectric vibrator according to claim 1, wherein the electrically insulating material of the second filler is lower in acoustic impedance than the first filler.

12. A piezoelectric vibrator comprising:
a piezoelectric resonator;
a substrate having opposite first and second principal surfaces; and
an electrically conductive holding member holding the piezoelectric resonator on the first principal surface of the substrate such that the piezoelectric resonator is able to be excited, wherein the electrically conductive holding member comprises:
an adhesive;
a first filler mixed in the adhesive, the first filler containing an electrically conductive material as a main component thereof; and
a second filler mixed in the adhesive, the second filler containing an electrically insulating material as a main component thereof and having a smaller Young's modulus than the first filler, and
in a plan view in a direction normal to the first principal surface of the substrate, a ratio (H1) of a volume of the first filler to a volume of the second filler in a central region of the electrically conductive holding member is higher than a ratio (H2) of a volume of the first filler to a volume of the second filler in an outer peripheral region of the electrically conductive holding member.

13. The piezoelectric vibrator according to claim 12, wherein in the plan view in the direction normal to the first principal surface of the substrate, part of the outer peripheral region of the electrically conductive holding member is disposed outside an outer edge of the piezoelectric resonator.

14. The piezoelectric vibrator according to claim 12, wherein the second filler comprises a plurality of spherical spacers that hold the piezoelectric resonator with a predetermined clearance from the first principal surface of the substrate.

15. The piezoelectric vibrator according to claim 14, wherein the plurality of spherical spacers are not coated with a metal.

16. The piezoelectric vibrator according to claim 14, wherein the plurality of spherical spacers are stacked in two layers in a height direction on the first principal surface of the substrate.

17. The piezoelectric vibrator according to claim 12, wherein the first filler contains silver as a main component.

18. The piezoelectric vibrator according to claim 17, wherein the second filler contains a silicone-based resin as a main component.

19. The piezoelectric vibrator according to claim 12, wherein the second filler contains a silicone-based resin as a main component.

20. The piezoelectric vibrator according to claim 12, further comprising a cover member bonded to the substrate such that the piezoelectric resonator is accommodated within an internal space defined by the cover member and the substrate.

* * * * *